United States Patent
Liu et al.

[11] Patent Number: 5,966,338
[45] Date of Patent: Oct. 12, 1999

[54] DRAM WITH NEW I/O DATA PATH CONFIGURATION

[75] Inventors: Lawrence C. Liu, Menlo Park, Calif.; Michael A. Murray, Bellevue, Wash.; Li-Chun Li, Los Gatos, Calif.

[73] Assignee: Mosel Vitelic Corporation, San Jose, Calif.

[*] Notice: This patent is subject to a terminal disclaimer.

[21] Appl. No.: 09/047,304

[22] Filed: Mar. 24, 1998

Related U.S. Application Data

[63] Continuation of application No. 08/844,541, Apr. 18, 1997, Pat. No. 5,781,488.

[51] Int. Cl.[6] .................................................. G11C 7/02
[52] U.S. Cl. ..................................... 365/207; 365/230.03
[58] Field of Search .............................. 365/230.03, 207, 365/208

[56] References Cited

U.S. PATENT DOCUMENTS

| | | | |
|---|---|---|---|
| 5,325,336 | 6/1994 | Tomishima et al | 365/207 |
| 5,329,494 | 7/1994 | Suzuki et al. | 365/230.03 |
| 5,367,488 | 11/1994 | An | 365/207 |
| 5,383,159 | 1/1995 | Kubota | 365/207 |
| 5,473,576 | 12/1995 | Matsui | 365/207 |
| 5,514,975 | 5/1996 | Sartwell et al. | 371/22.5 |
| 5,600,603 | 2/1997 | McDaniel | 365/207 |
| 5,631,912 | 5/1997 | Mote, Jr. | 371/22.3 |
| 5,644,543 | 7/1997 | Kim et al. | 365/207 |
| 5,648,928 | 7/1997 | Yoon et al. | 365/207 |
| 5,668,766 | 9/1997 | Braminik | 365/207 |
| 5,671,188 | 9/1997 | Patel et al. | 365/230.03 |
| 5,781,488 | 7/1998 | Liu et al. | 365/207 |

*Primary Examiner*—David Nelms
*Assistant Examiner*—Gene N. Auduong
*Attorney, Agent, or Firm*—Skjerven Morrill MacPherson Franklin & Friel LLP; Michael Shenker; Barmak S. Sani

[57] ABSTRACT

In accordance with this invention, a DRAM with a staggered bitline sense amplifier configuration utilizes an I/O data path scheme which minimizes the time delay through the I/O data path. The DRAM includes a first and a second memory arrays wherein a first external sense amplifier receives on an input terminal a signal corresponding to the state of a memory cell selected from the first memory array via a first column decoding circuit. A second external sense amplifier receives on an input terminal a signal corresponding to the state of a memory cell selected form the second memory array via a second column decoding circuit. Each of the two external sense amplifiers has an output terminal which are shorted together. A tristate signal feeding another input terminal of each of the two external sense amplifiers is used to eliminate data contention on the shorted output terminals.

5 Claims, 4 Drawing Sheets

DRAM WITH NEW I/O DATA PATH CONFIGURATION

CROSS-REFERENCE TO RELATED APPLICATIONS

The present application is a continuation of U.S. patent application Ser. No. 08/844,541, filed Apr. 18, 1997, now U.S. Pat. No. 5,781,488, issued Jul. 14, 1998.

FIELD OF THE INVENTION

This invention relates to dynamic random access memories (DPAMS) and in particular to a DRAM with a staggered bitline sense amplifier configuration which utilizes a new I/O data path scheme to minimize the time delay through and simplify the I/O data path.

BACKGROUND

One DRAM configuration utilizes an even number (such as two or four for example) of memory arrays arranged in pairs, with bitline sense amplifiers placed between each pair. The DRAM 10 in FIG. 1 illustrates such configuration. A pair of memory arrays 11 and 12 are shown with bitline sense amplifiers 13-i in between. Each bitline sense amplifier is connected to two pairs of bitlines, one pair from each memory array. For example, bitline pairs 11-3 and 12-3 in memory arrays 11 and 12, respectively, are connected to bitline sense amplifier 13-3.

Each of the pairs of bitlines 11-i and 12-i is connected to the respective bitline sense amplifier 13-i via a pair of select transistors not shown. The select transistors are used to connect either the bitline pair 12-i in memory array 12 or the bitline pair 11-i in memory array 11 to the sense amplifier 13-i.

A column decoding circuit (not shown) is used to select one of the bitline sense amplifiers 13-i, and provide a connection between the output terminals of the selected bitline sense amplifier and the data bus lines $DB_n$ and $\overline{DB}_n$. The I/O sense amplifier 20 is used for further amplification of the signals on $DB_n$ and $\overline{DB}_n$ lines prior to transmitting these signals to an output buffer (not shown)

Accordingly, upon selection of a particular wordline in one of the memory arrays, a memory cell (representing one bit of information) from one of the two memory arrays 11 and 12 is selected. The state of the selected memory cell is sensed and signals representing this state are then provided on data bus lines $DB_n$ and $\overline{DB}_n$.

Another DRAM configuration, shown in FIG. 2, utilizes what is known as a staggered bitline sense amplifier architecture. Unlike the DRAM configuration shown in FIG. 1 wherein all bitline sense amplifiers are arranged between pairs of memory arrays, in FIG. 2 the bitline sense amplifiers (shown as 43-i, 44-i and 45-i) are arranged in a staggered configuration with respect to each memory array.

Bitline sense amplifiers 44-i are utilized in a similar manner to those in FIG. 1. Bitline sense amplifiers 44-i are located between and shared by the two memory arrays 41 and 42. Each of the bitline sense amplifiers 44-i is connected to two pairs of bitlines, one pair from each memory array. For example, bitline pairs 404A and 404B in memory arrays 41 and 42, respectively, are connected to bitline sense amplifier 44-2.

Bitline sense amplifiers 43-i and 45-i are located on the left side of memory array 41 and the right side of memory array 42, respectively, and will be referred to as the end-cap bitline sense amplifiers hereinafter. As shown, each of the end-cap bitline sense amplifiers 43-i and 45-i are connected to one pair of bitlines in the memory arrays 41 and 42, respectively.

All bitline sense amplifiers in FIG. 2 are similar in that each bitline sense amplifier receives two pairs of bitlines. Since the end-cap sense amplifiers 43-i and 45-i only receive one pair of bitlines from the respective memory arrays, dummy bitlines (also referred to as end-cap bitlines) are used as the second pair of bitlines. For example, end-cap bitlines 401A and 403A are used as the second pair of bitlines for the end-cap bitline sense amplifiers 43-1 and 43-2, respectively.

As shown in FIG. 2, the bitline sense amplifiers 44-i are connected to every other pair of bitlines in memory arrays 41 and 42, while the alternate bitlines are connected to the end-cap bitline sense amplifiers 43-i and 45-i; hence the name "staggered sense amplifier" architecture. In this manner, half of the memory cells in memory array 42 are connected by bitline pairs (shown, for example, as 401C and 403C) to end-cap bitline sense amplifiers 45-i, while the other half of the memory cells are connected by bitline pairs (shown, for example, as 402B and 404B) to bitline sense amplifiers 44-i. The memory cells in memory array 41 are similarly connected to the bitline sense amplifiers 43-i and 44-i.

Typically, a memory chip consists of more memory arrays than those shown in FIG. 2. Such a memory chip would include additional memory array arrangements similar to that formed by the bitline sense amplifiers 44-i and memory arrays 41 and 42. Note that in such a chip, the end-cap arrangements shown in FIG. 2, i.e., the end-cap bitlines and the end-cap bitline sense amplifiers, are provided only once for each end of the overall memory block.

A specific memory location is selected by selecting the corresponding wordline and the appropriate pair of bitlines. As in any memory array, the wordlines in memory arrays 41 and 42 (not shown) extend across the array in the direction perpendicular to the bitlines. To read out a memory cell, one wordline is selected from among the wordlines in memory arrays 41 and 42. The selected word line activates one row of memory cells; however, only the memory cells connected to the selected bitline pair will be read.

Each bitline in memory arrays 41 and 42 is connected to a select transistor not shown. A bitline pair is selected by activating the corresponding select transistors. The activated select transistors provide a connection between the pair of bitlines and the input terminals of the corresponding bitline sense amplifier. In this manner a direct connection is provided between the selected memory cell and the input terminals of a bitline sense amplifier.

Upon sensing the state of the selected memory cell, the bitline sense amplifier provides signals on its output terminals representing the state of the selected memory cell. The output terminals of each of the bitline sense amplifiers are connected to a pair of data bus lines DB and $\overline{DB}$ via a second set of select transistor pairs not shown. These select transistors are part of a decoding scheme wherein by activating a pair of select transistors, a connection is made between the output terminals of a bitline sense amplifier and the corresponding pair of data bus lines.

The column decoding scheme activates a specific select transistor depending upon (i) the array within which the wordline is selected, hereinafter referred to as the selected array, and (ii) the selected bitline pair in the selected array. For example, if a wordline and the bitline pair 403C are selected from memory array 42, the pair of select transistors which connect the output terminals of the end-cap bitline sense amplifier 45-2 to the data bus lines $DB_R$ and $\overline{DB}_R$ are activated.

As in the DRAM configuration of FIG. 1, once the data is provided on the appropriate DB and $\overline{DB}$ lines, a second amplification is carried out. The I/O sense amplifiers 60 and 70 perform this task. The I/O sense amplifier 60 receives $DB_n/\overline{DB}_n$ lines at its input terminals and provides a signal representing the state of the sensed memory cell on its output terminal $DO_n$. The output terminal $DO_n$ is in turn fed to an output buffer circuit not shown.

Due to the staggering of the bitline sense amplifiers, a selection needs to be made between the $DB_L/\overline{DB}_L$ lines and $DB_R/\overline{DB}_R$ lines prior to amplification of the signals on these lines. Multiplexer 80 performs this selection in response to an asserted input signal <A> or <B> from the selected array 41 or 42, respectively. If input signal <A> is asserted, the signals on $DB_L/\overline{DB}_L$ lines are passed through for amplification. If input signal <B> is asserted, the signals on $DB_R/\overline{DB}_R$ lines are passed through for amplification.

I/O sense amplifier 70 then amplifies the signals on the selected data bus lines. I/O Sense amplifier 70 provides the amplified signal on its output terminal $DO_m$. The output terminal $DO_m$ is in turn fed to an output buffer not shown.

The initial sensing performed by the bitline sense amplifier is in the critical speed path (what is commonly referred to as the "address access time") of the memory chip. Thus, it is desirable to minimize the time delay associated with amplifying and transmitting the small signal associated with the selected memory cells. However, two factors hinder reducing the time delay. First, the area within which each bitline sense amplifier is physically laid out is limited to the pitch of two bitlines. As such, the drive capability of the bitline sense amplifiers is severely limited because the transistors in the bitline sense amplifiers cannot be made as large as desired.

Second, since the output terminals of the selected bitline sense amplifier are connected to the corresponding data bus lines, the selected bitline sense amplifier is required to drive the capacitive loading associated with the data bus lines. The data bus line capacitance increases as the length of the data bus line increases.

The impact of the first factor, namely the area limitation, is reduced by staggering the bitline sense amplifiers. Staggering the bitline sense amplifiers doubles the space within which each bitline sense amplifier is laid out, i.e., within a pitch of four bitlines rather than two. However, the time delay degradations due to the second factor is further exacerbated because of the additional data bus line routing required in providing both sets of data bus lines $DB_L/\overline{DB}_L$ and $DB_R/\overline{DB}_R$ to the multiplexer 80.

In order for the multiplexer 80 to carry out the selection function, either $DB_L/\overline{DB}_L$ lines or $DB_R/\overline{DB}_R$ lines need to be routed across a portion of the chip, as illustrated in FIG. 2. The additional routing significantly increases the interconnect capacitance on the routed data bus lines, thereby degrading the address access time.

Furthermore, unlike the read path represented by $DB_n/\overline{DB}_n$ lines and I/O sense amplifier 60, the read paths represented by $DB_L/\overline{DB}_L$ and $DB_R/\overline{DB}_R$ lines include multiplexer 80. The gate delay associated with multiplexer 80 causes additional time delay.

Therefore, the capacitive loading due to the additional routing of the $DB_L/\overline{DB}_L$ and $DB_R/\overline{DB}_R$ lines coupled with the gate delay associated with multiplexer 80, degrade the overall speed of the DRAM device. These drawbacks hinder achieving the desired device address access times, specially in high speed DRAM designs.

SUMMARY

In accordance with this invention, a DRAM with a staggered bitline sense amplifier configuration utilizes an Input/Output (I/O) data path scheme which reduces the time delay through and simplifies the I/O data path as compared to the prior art.

The DRAM includes a first memory array and a second memory array and two column decoding circuits. The first column decoding circuit is associated with the first memory array and is located on the outside edge of the first memory array. The second column decoding circuit is associated with the second memory array and is located on the outside edge of the second memory array. Each of the two column decoding circuits includes a group of internal sense amplifiers. Each of the internal sense amplifiers has a pair of input terminals and a pair of output terminals.

In the first column decoding circuit, the pairs of input terminals of all the internal sense amplifiers are connected to alternate pairs of bitlines $BL_a$ and $\overline{BL}_a$ in the first memory array via a first set of select transistor pairs. The pairs of output terminals of all the internal sense amplifiers in the first column decoding circuit are connected to a first pair of data bus lines $DB_a$ and $\overline{DB}_a$ via a second set of select transistor pairs.

Similarly, in the second column decoding circuit, the pairs of input terminals of all the internal sense amplifiers are connected to alternate pairs of bitlines $BL_b$ and $\overline{BL}_b$ in the second memory array via a first set of select transistor pairs. The pair of output terminals of all the internal sense amplifiers in the second column decoding circuit are connected to a second pair of data bus lines $DB_b$ and $\overline{DB}_b$ via a second set of select transistor pairs.

The DRAM further includes a first external sense amplifier and a second external sense amplifier. Each external sense amplifier has a pair of input terminals and an output terminal. The pairs of input terminals of the first and the second external sense amplifiers are connected to data bus lines $DB_a/\overline{BL}_a$ and $DB_b/\overline{BL}_b$, respectively.

The output terminals of the first and second external sense amplifiers are shorted together. Each of the first and second external sense amplifiers also has a third input terminal which receives a tristate signal. The tristate signal is used to place one of the two external sense amplifiers in tristate (high impedance) during each read cycle in order to prevent data contention on the shorted output terminals. The shorted output terminals provides the signal corresponding to the state of the memory location selected from either the first memory array or the second memory array via the corresponding column decoding circuit.

One feature of this invention is that the capacitive loading on the data bus lines $DB_a/\overline{DB}_a$ and $DB_b/\overline{DB}_b$ due to routing is minimized, thereby improving the time delay through the I/O data path.

Another feature of this invention is that the multiplexer needed in prior art to select between the two arrays is eliminated, and as such the time delay through the I/O data path is improved by removing the gate delay associated with the multiplexer.

These and other features and advantages of the present invention will become more apparent from the following description and the accompanying drawings.

DETAILED DESCRIPTION

While one embodiment of this invention will be described, other embodiments of this invention will be obvious in view of this description, which is illustrative only and not limiting.

Figure 1:
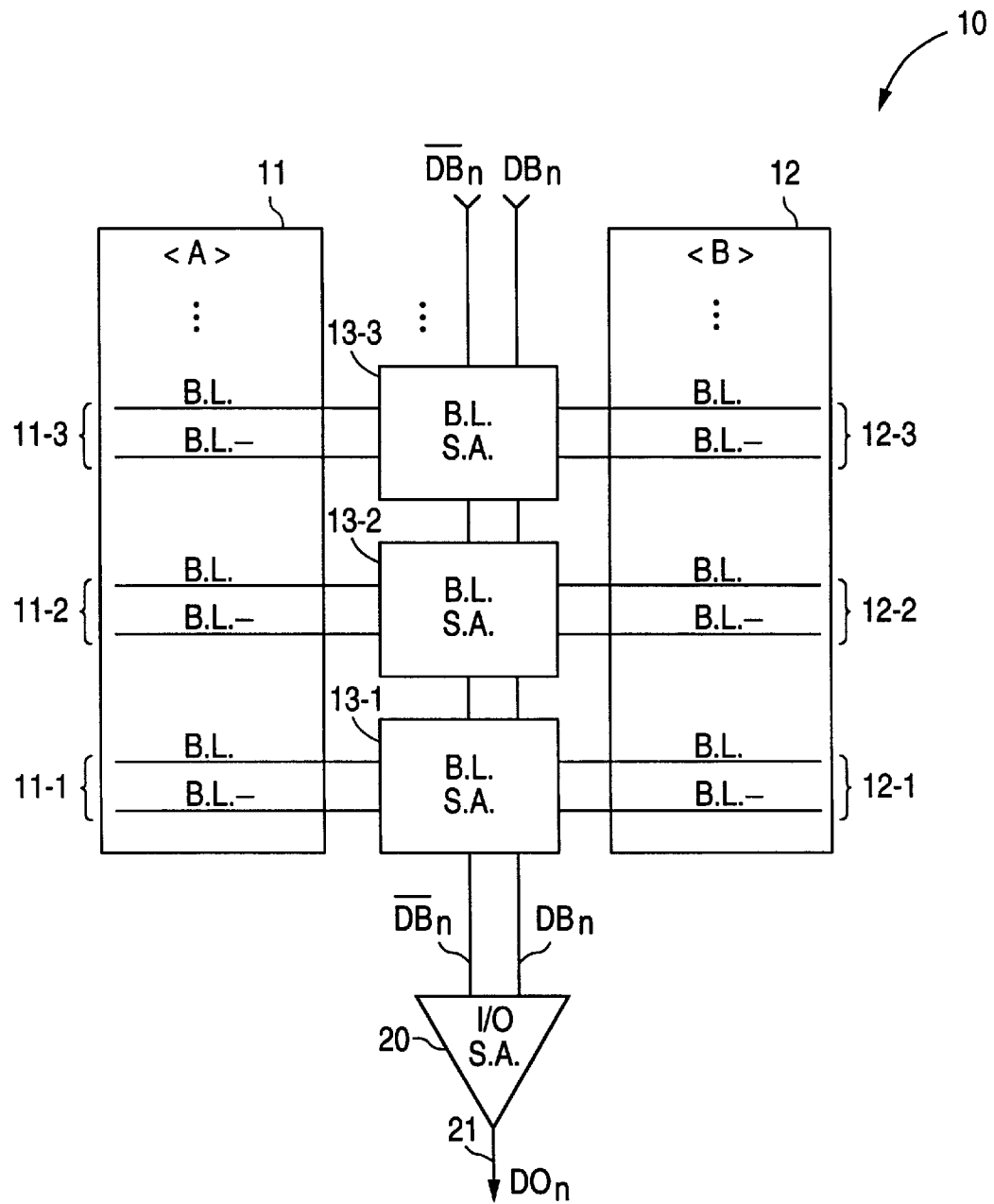
FIG. 1 illustrates a DRAM configuration in which a pair of memory arrays are shown with bitline sense amplifiers placed between the pair of memory arrays.
Figure 2:
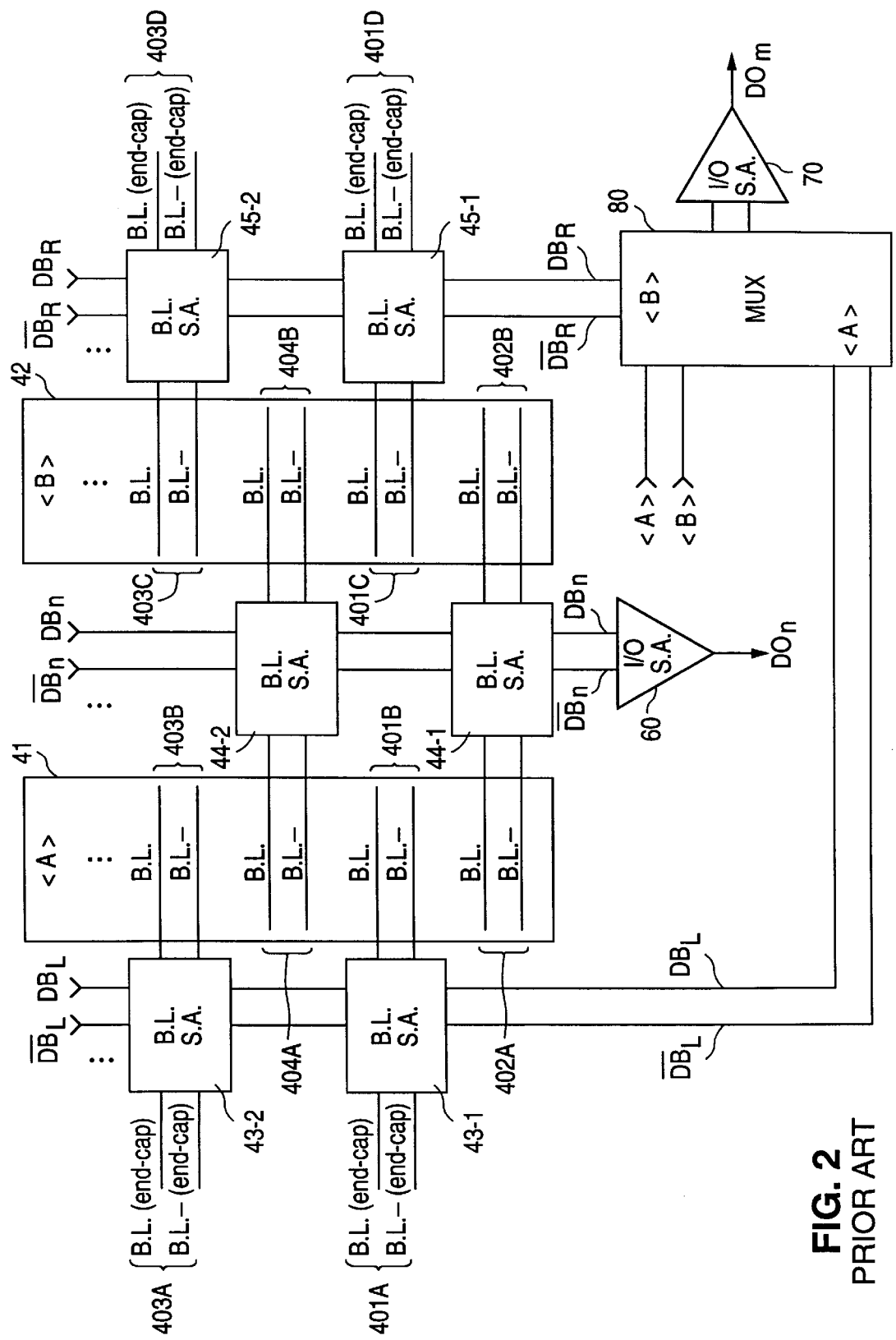
FIG. 2 illustrates another DRAM configuration in which the bitline sense amplifiers are organized in a staggered arrangement, and a multiplexer is used in the I/O data path.
Figure 3:
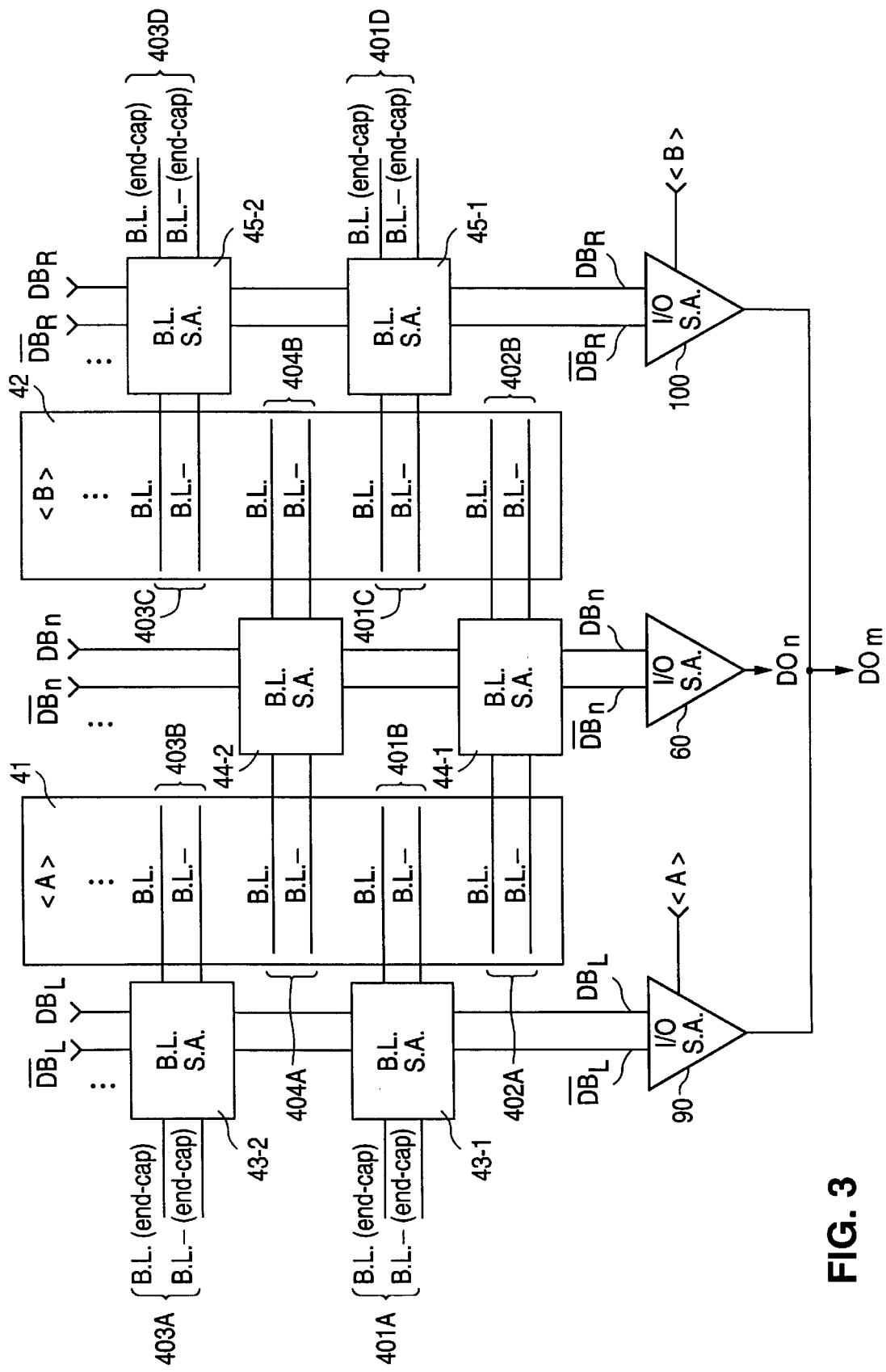
FIG. 3 illustrates the same DRAM configuration as in FIG. 2 but with new I/O circuitry in accordance with this invention.

Turning to FIG. 3, the structure of FIG. 3 is identical to the structure of FIG. 2, except that the multiplexer 80 and I/O sense amplifier 70 of FIG. 2 are eliminated and I/O sense amplifiers 90 and 100 are introduced. In this manner, each of the data bus lines $DB_L/\overline{DB}_L$ and $DB_R/\overline{DB}_R$ independently feed an I/O sense amplifier, similar to $DB_n/\overline{DB}_n$ lines.

By utilizing I/O sense amplifiers 90 and 100 rather than the multiplexer 80, the interconnect routing of both $DB_L/\overline{DB}_L$ and $DB_R/\overline{DB}_R$ lines is minimized. Accordingly, the speed degradation associated with the additional routing of these lines as shown in FIG. 2, is eliminated. In fact, all data bus lines are routed the same distance and thus possess identical interconnect capacitance. As such, the capacitive loading driven by the selected bitline sense amplifier will be the same for all selected bitline sense amplifiers.

Furthermore, the gate delay associated with multiplexer 80 in FIG. 2 is eliminated. Therefore, unlike the I/O configuration in FIG.2, the time delay through all the data bus lines and the I/O sense amplifiers will be the same.

The I/O configuration of FIG. 3 however, raises two new issues. First, even though the I/O configuration of FIG. 3 eliminates the excess routing of the outer data bus lines, an equal amount of routing is required at the output terminals of I/O sense amplifiers 90 and 100 in order to short these two terminals together, as shown in FIG. 3. But, the area constraints and the resulting drive limitations of the bitline sense amplifiers, described above, do not exist with respect to the I/O sense amplifiers 60, 90 and 100. I/O sense amplifiers 60, 90 and 100 are: (i) laid out in the periphery region where no substantial area limitations are present, and (ii) are much fewer in number as compared to the bitline sense amplifiers. Therefore, any additional capacitance due to the excess routing of the output terminals of the I/O sense amplifiers 90 and 100, shown as output terminal $DO_m$, can be compensated for by properly designing the I/O sense amplifiers to provide the requisite drive.

Second, with the output terminals of the I/O sense amplifiers 90 and 100 shorted together, data contention on output terminal $DO_m$ needs to be avoided. To prevent data contention on the output terminal $DO_m$ the two I/O sense amplifiers 90 and 100 are modified as compared to the I/O sense amplifier 60. I/O sense amplifiers 90 and 100 have the capability of being placed in tristate (high impedance output terminal). Signals <A> and <B> are used to place I/O sense amplifiers 90 and 100 in tristate. If memory array <A> is selected, signal <B> is asserted placing I/O sense amplifier 100 in tristate. Similarly, I/O sense amplifier 90 is placed in tristate via signal <A> if memory array <B> is selected.

Figure 4:
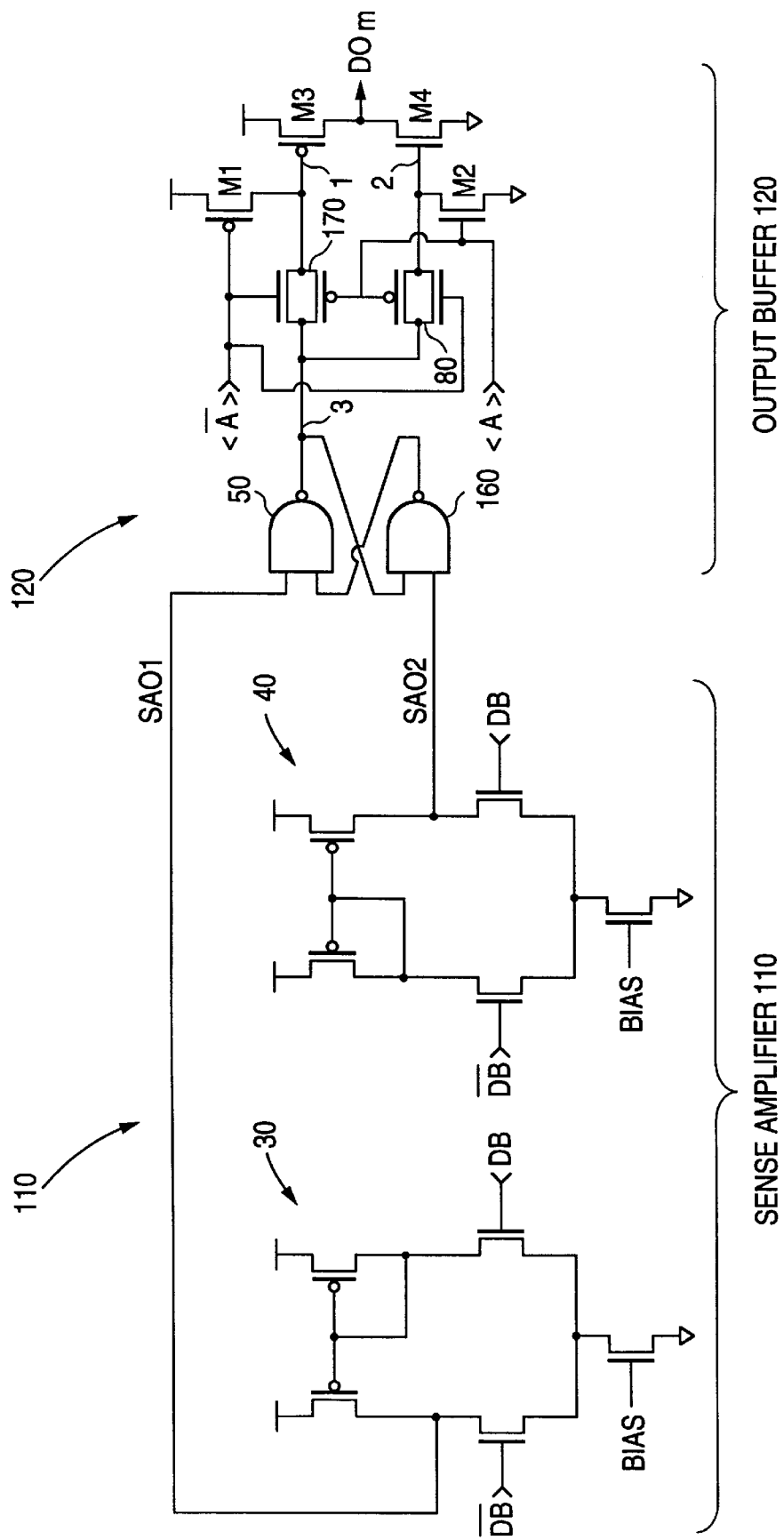
FIG. 4 shows one circuit implementation of the I/O sense amplifiers 90 and 100 of FIG. 3.

FIG. 4 shows one circuit implementation of the I/O sense amplifier 90 or 100 and the tristate scheme. The circuit of FIG. 4 comprises a sense amplifier stage 110 and an output buffer stage 120. The sense amplifier stage 110 comprises two single-ended differential amplifiers 30 and 40. The single-ended differential amplifiers 30 and 40 receive data bus lines DB and $\overline{DB}$ at their respective input terminals, and provide an output signal on output terminals SAO1 and SAO2, respectively. The differential amplifiers 30 and 40 amplify the signals on $DB/\overline{DB}$ lines independently. However, by reversing the $DB/\overline{DB}$ connection to the input terminals of the differential amplifiers 30 and 40, the signal on output terminals SAO1 and SAO2 are made to move in opposite directions, and as such additional amplification of the $DB/\overline{DB}$ signal is achieved.

Signals SAO1 and SAO2 are in turn provided as input signals to the output buffer stage 120. The output buffer stage 120 comprises a cross coupled pair of 2-input NAND gates 50 and 160, receiving SAO1 and SAO2 input signals and providing an output signal on terminal 3. Terminal 3 is fed to the source sides of the two CMOS pass gates 170 and 80. The CMOS pass gates 170 and 80 in combination with transistors M1 and M2 perform the tristate function. The drain sides of the two CMOS pass gates 170 and 80, marked as 1 and 2, respectively, in turn drive the gates of output driver devices M3 and M4, respectively.

Signals <A> and <$\overline{A}$> place the output buffer 120 in tristate. When signals <A> and <$\overline{A}$> are at logic high level and logic low level, respectively, the CMOS pass gates 170 and 80 are in the off state, while both transistors M1 and M2 are fully on. With the CMOS pass gates in the off state, transistor M1 will pull node 1 up to VCC potential, while transistor M2 will pull node 2 down to ground potential. With node 1 in a high state and node 2 in a low state both transistors M3 and M4 are shut off, and therefore the output terminal $DO_m$ is undriven and thereby in the high-impedance (tristate) state.

With signals <A> and <$\overline{A}$> at logic low level and logic high level, respectively, the CMOS pass gates 170 and 80 are fully on, while both transistors M1 and M2 are shut off. Under this condition, the output terminal $DO_m$ will reflect the state of the DB and $\overline{DB}$ signals.

The circuit of FIG. 4 is one of many different ways of implementing the tristate function of the I/O sense amplifiers 90 and 100, and as such is illustrative only and not limiting.

While one embodiment of this invention has been described, other embodiments of this invention will be obvious in view of this description. The invention is further intended to include all variations and modifications falling within the scope of the appended claims.

What is claimed is:

1. An integrated circuit comprising:

a plurality of memory arrays arranged in a line extending from left to right, each memory array comprising a plurality of columns of memory cells, the memory arrays including two end memory arrays, one of the end memory arrays being a left end memory array and the other one of the end memory arrays being a right end memory array;

a column decoding and amplifier circuit between every two adjacent memory arrays, the column decoding and amplifier circuit comprising sense amplifier circuitry for amplifying signals from columns of the adjacent arrays, the column decoding and amplifier circuit being for selecting 1 column from N columns of the adjacent arrays and for providing an amplified signal representing data from the selected column, where N is a predetermined number;

a left end column decoding and amplifier circuit on the left of the left end memory array, the left end column decoding and amplifier circuit comprising sense amplifier circuitry for amplifying signals from columns of the left end memory array, the left end column decoding and amplifier circuit being for selecting 1 column from N/2 columns of the left end memory array and for providing an amplified signal representing data from the selected column;

a right end column decoding and amplifier circuit on the right of the right end memory array, the right end column decoding and amplifier circuit comprising sense amplifier circuitry for amplifying signals from columns of the right end memory array, the right end column decoding and amplifier circuit being for selecting 1 column from N/2 columns of the right end memory array and for providing an amplified signal representing data from the selected column;

one sense amplifier for each of said column decoding and amplifier circuits between adjacent memory arrays, the sense amplifier being for further amplifying the amplified signal provided by the respective column decoding and amplifier circuit and for providing a further amplified signal representing data from the column selected from the N columns of the respective adjacent memory arrays;

a first sense amplifier for further amplifying the amplified signal provided by the left column decoding and amplifier circuit and for providing a further amplified signal representing data from the column selected from the N/2 columns of the left memory array;

a second sense amplifier for further amplifying the amplified signal provided by the right column decoding and amplifier circuit and for providing a further amplified signal representing data from the column selected from the N/2 columns of the right memory array; and a node for receiving the further amplified signals from the first or the second sense amplifier in response to selection of the right end memory array or the left end memory array, signal on the node thus representing data from 1 column out of N columns of the left and right memory arrays, the N columns consisting of the N/2 columns of the left memory array and the N/2 columns of the right memory array.

2. The integrated circuit of claim 1 wherein the N columns of each pair of adjacent arrays consist of N/2 columns of each of the two adjacent arrays.

3. The integrated circuit of claim 1 wherein each memory array comprises N columns of memory cells, and each sense amplifier circuitry between adjacent memory arrays comprises N/2 sense amplifiers in a staggered arrangement such that every other column of each memory array is to be connected, when selected, to a sense amplifier on the left of the memory array, and every other column of the memory array is to be connected, when selected, to a sense amplifier on the right of the memory array.

4. The integrated circuit of claim 1 wherein each memory array is a dynamic random access memory array.

5. The integrated circuit of claim 1 wherein the first and second sense amplifiers are located in a periphery of an area comprising the memory arrays, the column decoding and amplifier circuits, and the sense amplifiers.

* * * * *